(12) United States Patent
Narvaez et al.

(10) Patent No.: US 6,396,135 B1
(45) Date of Patent: May 28, 2002

(54) SUBSTRATE FOR USE IN SEMICONDUCTOR PACKAGING

(75) Inventors: Glenn C. Narvaez, Redwood City; Shaw Wei Lee, Cupertino, both of CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/748,309

(22) Filed: Dec. 21, 2000

(51) Int. Cl.$^7$ ............................................. H01L 23/02
(52) U.S. Cl. ..................... 257/678; 257/783; 438/106
(58) Field of Search .................. 257/678, 697, 257/737, 738, 777, 778, 780, 781, 782, 783, 784, 787

(56) References Cited

U.S. PATENT DOCUMENTS

| | | | | |
|---|---|---|---|---|
| 5,541,450 A | * | 7/1996 | Jones | 257/697 |
| 6,172,419 B1 | * | 1/2001 | Kinsman | 257/701 |
| 6,194,782 B1 | * | 2/2001 | Katchmar | 257/718 |
| 6,255,740 B1 | * | 7/2001 | Tsuji | 257/668 |
| 6,265,759 B1 | * | 7/2001 | Distefano | 257/693 |

* cited by examiner

Primary Examiner—David Nelms
Assistant Examiner—Andy Huynh
(74) Attorney, Agent, or Firm—Beyer Weaver & Thomas, LLP

(57) ABSTRACT

A number of techniques and substrate arrangements are described that working individually and in common have been found to significantly improve the environmental resistance of the resulting package. In one aspect, conductive pads (referred to herein as landing pads) on the top surface of a substrate are slightly undercut. This permits molding material applied during later packaging to flow into the undercut regions to help improve adhesion between the substrate and the molding material. In another aspect, metallic die attach pads formed on the substrate are patterned to provide better adhesion between the substrate and a solder mask that covers the die attach pads. More specifically, the metallic die attach pads are patterned to have a number of opening defined therein that leave corresponding portions of the substrate exposed. In substrates where a solder mask is applied over the die attach pad, the openings permit the solder mask to adhere directly to the substrate panel in the openings thereby strengthening the attachment of the solder mask to the substrate. In still another aspect, elongated slots are provided in the solder mask such that the slots expose one or more rows of adjacent landing pads instead of simply the landing pads themselves. With this arrangement, some substrate material between adjacent landing pads is exposed which tends to improve the adhesion of molding material to the substrate.

15 Claims, 7 Drawing Sheets

SUBSTRATE FOR USE IN SEMICONDUCTOR PACKAGING

FIELD OF THE INVENTION

The present invention relates generally to semiconductor packaging, and more specifically to mechanisms for improving environmental resistance of semiconductor packages.

BACKGROUND

In the development of new semiconductor packages, one constant concern is the package's overall environmental resistance. One important feature of environmental resistance is moisture sensitivity. The moisture sensitivity concerns are sufficiently large that standard ratings have been promulgated for measuring environmental resistance. For example, JEDEC has promulgated moisture sensitivity testing standards that generally identify four levels of moisture resistance for semiconductor packages (i.e., the JEDEC MSL rating in which level 4 is the lowest resistance and level 1 is the highest). In practice, it is often desirable for manufactures to identify the JEDEC MSL rating of a particular package. Customers (as well as the manufactures) often utilize this information in determining features such as permissible shelf life, acceptable applications of the product, the precautions against moisture that must be taken during shipping and storage, etc.

There are a wide variety of semiconductor packaging arrangements. Many state of the art package designs utilize a dielectric substrate formed from a suitable material such as BT (bizmaleimide trazine) to support the die and to provide appropriate routing to external contacts. Generally, the substrate has conductive elements (such as traces, and vias) that electrically connect landing pads on the top surface of the substrate to associated contacts on the back surface of the substrate (which in turn are used to electrically connect the die to external devices). The conductive elements are typically metallic (e.g. copper or gold) and any portions of the conductive elements that do not need to be exposed for wire bonding or soldering are often covered with a solder mask for protection.

One representative package arrangement using such a substrate is illustrated in FIG. 7. Typically, a die 25 is mounted on the substrate 27 and wire bonded to landing pads on the top surface of the substrate. A plastic cap 30 is typically molded over the top surface of the substrate to protect the die 25 and bonding wires 32. It is generally understood that the interfaces between adjacent layers in the resultant package (e.g., between the metalization and/or the solder mask and/or molding material and/or the substrate) can potentially delaminate which may lead to device failure. It is also generally understood that moisture penetration is one of the leading causes of delamination. Thus, there are continuing efforts to further improve substrate and package designs to reduce the probability of delamination and/or other environmentally induced failures in substrate based packages.

SUMMARY

In accordance with the present invention, a number of techniques and substrate arrangements have been proposed that working individually and in common have been found to significantly improve the environmental resistance of the resulting package. In one aspect, conductive pads (referred to herein as landing pads) on the top surface of a substrate are slightly undercut. This permits molding material applied during later packaging to flow into the undercut regions to help improve adhesion between the substrate and the molding material. The undercut landing pads can be formed in a number of ways. By way of example, in multi-layered landing pad structures an upper layer of each undercut landing pad may be designed to have a larger footprint than a corresponding lower layer of the undercut landing pad thereby forming the undercut. For example, one common layered landing pad structure contemplates the use of a copper or copper alloy base layer that is covered with a gold layer that is better suited for wire bonding (typically with a barrier layer interposed therebetween). In such a structure the gold and barrier layers can have a larger footprint than the copper layer thereby forming the undercut structure.

In another aspect, metallic die attach pads formed on the substrate are patterned to provide better adhesion between the substrate and a solder mask that covers the die attach pads. More specifically, the die attach pads are patterned to have a number of openings defined therein that leave corresponding portions of the substrate exposed. In substrates where a solder mask is applied over the die attach pad, the openings permit the solder mask to adhere directly to the substrate panel in the openings thereby strengthening the attachment of the solder mask to the substrate.

In still another aspect, elongated slots are provided in the solder mask such that the slots expose one or more rows of adjacent landing pads instead of simply the landing pads themselves. With this arrangement, some substrate material between adjacent landing pads is exposed which tends to improve the adhesion of molding material to the substrate.

BRIEF DESCRIPTION OF THE DRAWING

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail in order to not unnecessarily obscure the present invention.

Figure 1:
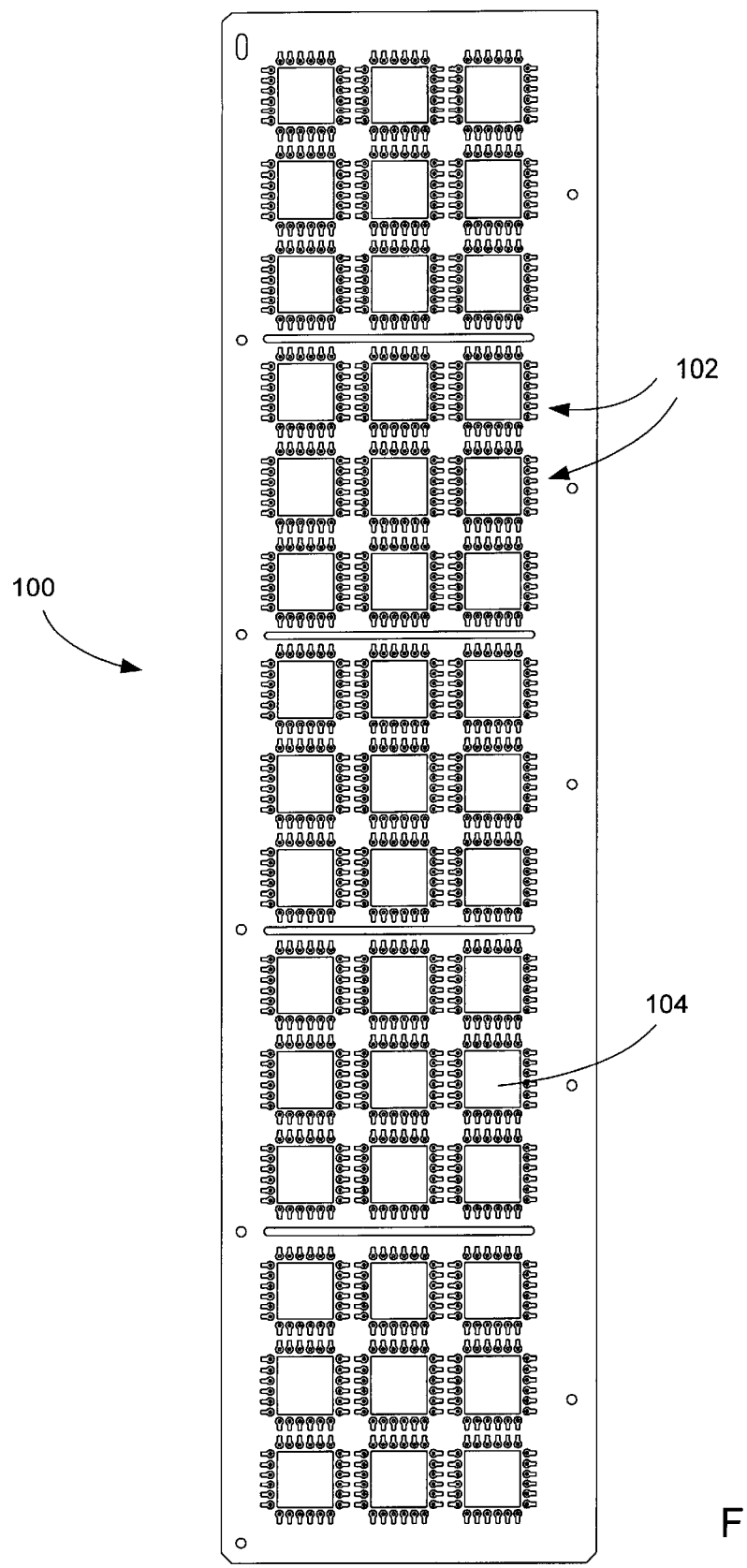
FIG. 1 is a diagrammatic top view of a substrate panel in accordance with one embodiment of the present invention.
Figure 2:
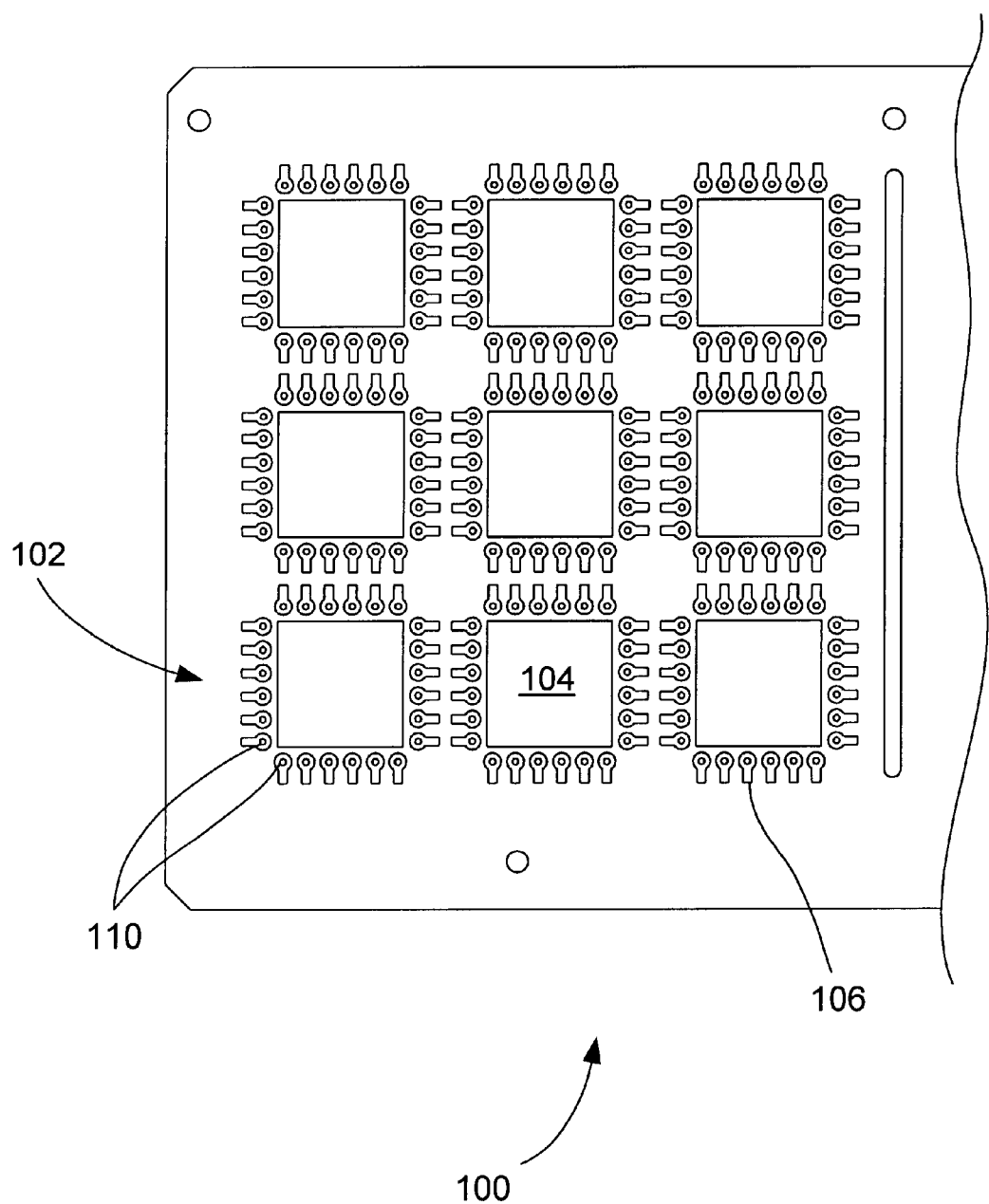
FIG. 2 is an expanded top view of a single array of device areas in the substrate panel of FIG. 1.

Referring initially to FIGS. 1 and 2, a representative substrate panel 100 that incorporates the present invention will be described. The substrate panel 100 has a plurality of arrays of device areas 102 defined thereon. The top surface of each device area 102 includes a die attach pad 104 and a plurality of landing pads 106 arranged in rows about the periphery of the die attach pad 104. Each landing 106 is electrically coupled to an associated via 110 that electrically connects the landing 106 to an associated contact pad (not shown) on the bottom surface of the substrate panel.

As will be appreciated by those skilled in the art, the substrate panel and the conductive features on the substrate panel (e.g., the landing pads, the vias, the contact pads and the die attach pads), can all be formed using a wide variety of conventional techniques. The substrate may be formed from a wide variety of materials. In the described embodiment a laminate substrate such as BT (bizmaleimide trazine) is used. The conductive features can be formed from any suitable material and may be composed of a single material (such as copper) or a layered structure. In the described embodiment, the conductive features are layered structures formed from a copper base. Certain exposed features, specifically the landings 106 and the contact pads (and optionally the die attach pad) are gold plated. A suitable barrier material, as for example, Nickel may be used to improve the bond between the copper and gold layers.

Figure 3:
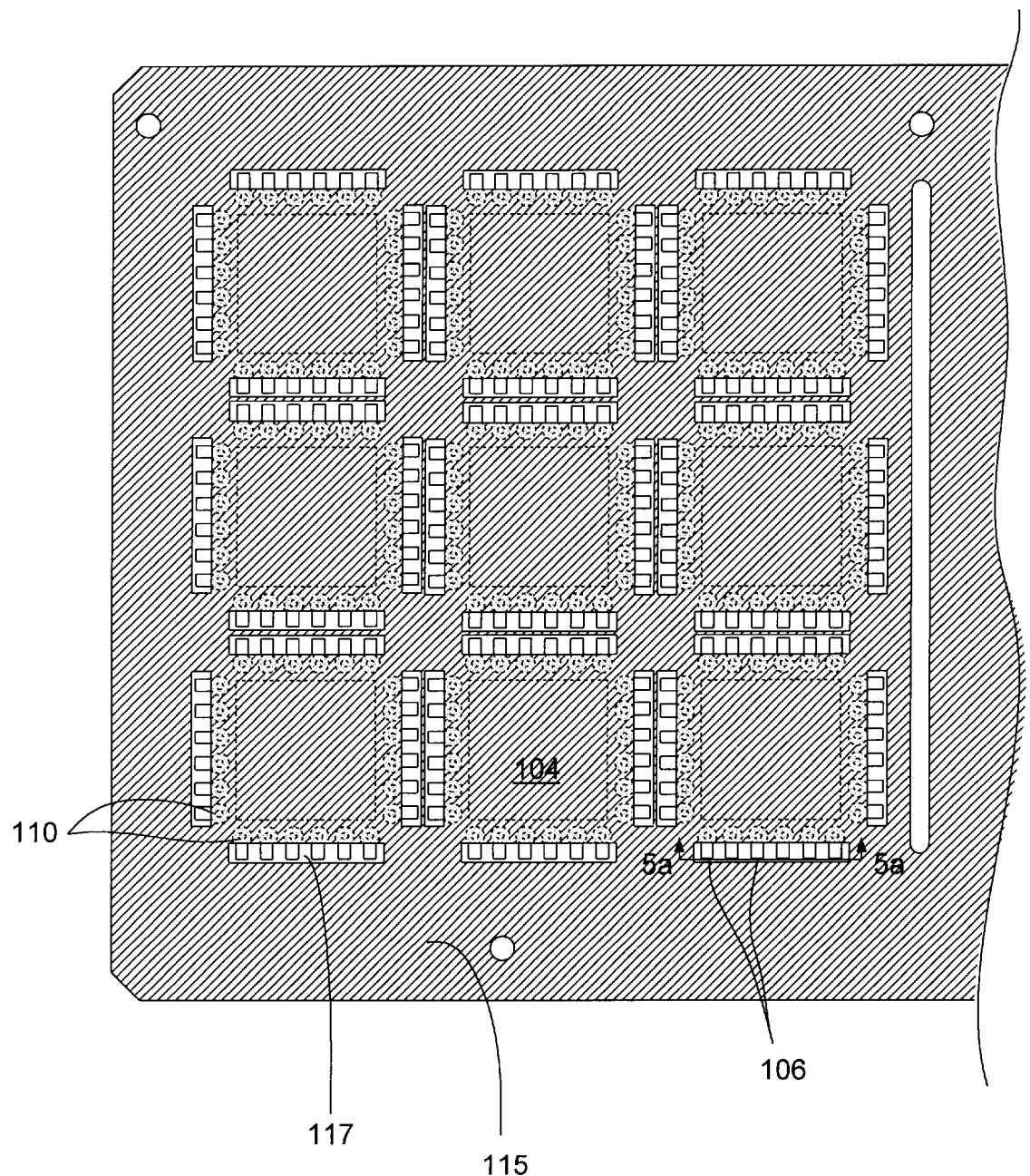
FIG. 3 is a top view of a single array of device areas in the substrate panel highlighting a solder mask applied to the panel in accordance with one embodiment of the invention.

As best shown in FIG. 3, a solder mask 115 covers a significant portion of the top surface of each device area 102 in including the die attach pad 104. Elongated slots 117 are provided in the solder mask to expose rows of landing pads 106 to facilitate wire bonding while covering the corresponding vias 110. By exposing a row of landing pads, as opposed to simply individual portions of each landing pad as is often done, some of the substrate is exposed as well. It is well known that molding material typically adheres better to the BT substrate material than to the solder mask. Thus, exposing sections of the substrate tends to improve the adhesion of the molding material to the substrate panel and thus the environmental resistance of the resulting packages. In the embodiment shown, the landing pads 106 are in a uniform single rows about the four edges of the die attach pad 104. Thus four elongated slots are provided. However if multiple rows of landing pads were provided on each side it should be appreciated that additional elongated slots 117 could be used to expose additional rows. The elongated slots are shown as being rectilinear and extending to cover all of the landing pads along a particular side of the device area. However, it should be appreciated that these are not requirements and that the shape, length and relative proportions of the elongated slots may be widely varied. Also, the slots do not need to necessarily extend the length of an entire row, although such an arrangement is generally preferred.

Figure 4:
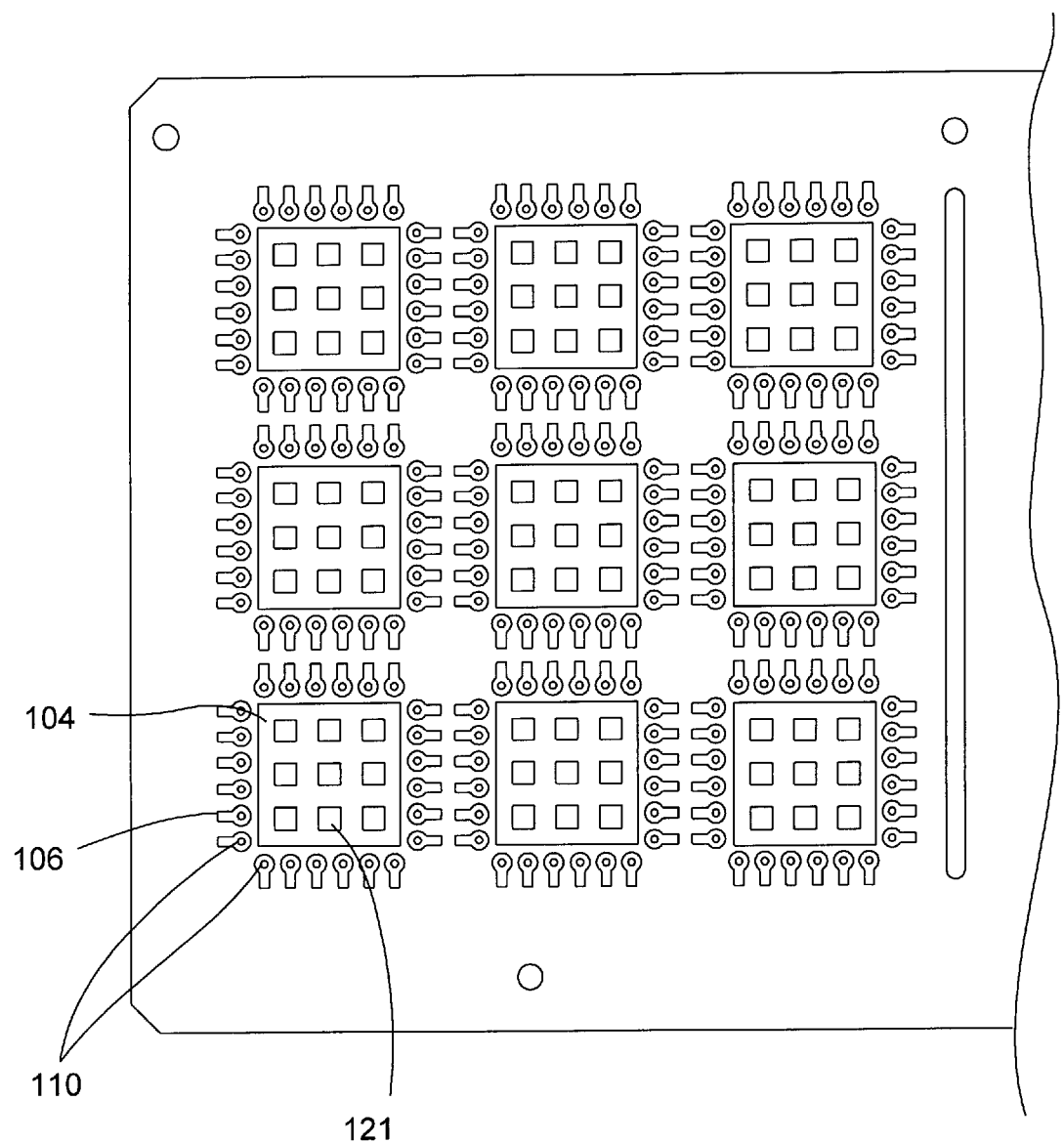
FIG. 4 is top view of a single array of device areas highlighting the metalization on the top surface of a substrate formed in accordance with another embodiment of the invention.

As better seen in FIG. 4, the die attach pads 104 have a patterned surface area that includes a number of internal openings 121 that expose corresponding portions of the substrate 100. The reason for the patterning the die attach pad is to leave portions of the substrate exposed within the die attach pad. With this arrangement, the solder mask (not shown in FIG. 4, but shown in FIG. 3) adheres better to the substrate panel since the solder material will generally adhere better to BT substrate than to the metal of the die attach pad (e.g., gold, copper or other metal layer). The improved adhesion between the solder mask and the substrate panel again tends to improve the environmental resistance of the resulting package. In the embodiment shown, the die attach pad opening pattern is a patched pattern. However, it should be apparent that the arrangement of the openings can be widely varied and of course, the pattern does not need to be uniform.

It should be appreciated that since gold is quite inert, solder mask to gold interfaces tend to be the weakest points of attachment for the solder mask. Thus, as a general design criteria it is generally desirable to minimize the amount of gold plating underneath the solder mask. For example, it is generally advantageous not to gold plate the portions of the landing pads 106 that cover vias 110 and are not exposed by slots 117. Similarly, it is generally preferable (although not required) not to gold plate the die attach pads 104.

Figure 5A:
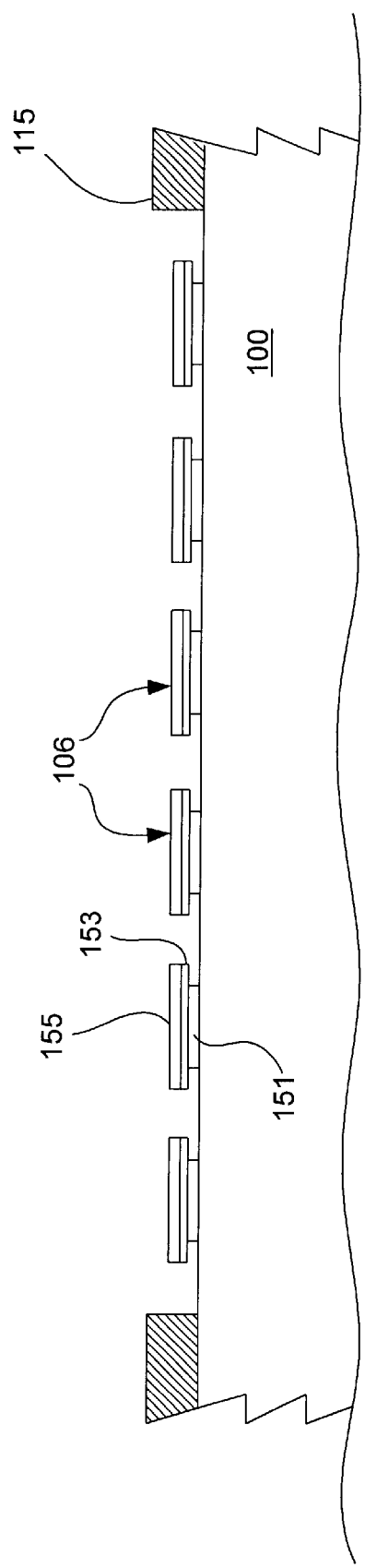
FIGS. 5(*a*) and 5(*b*) are cross sectional side views of a row of landing pads highlighting the undercut nature of the pads before and after molding respectively.
Figure 5B:
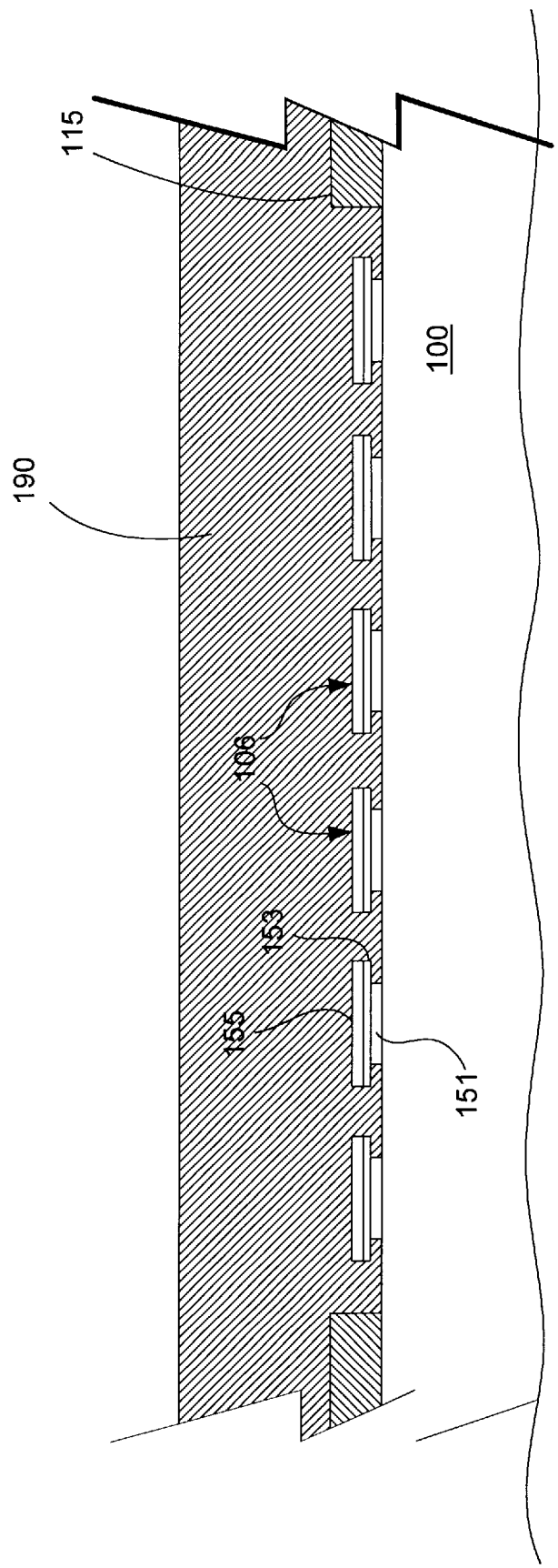

Referring next to FIGS. 5(*a*) and 5(*b*), another mechanism used to improve the adhesion between the molding material and the substrate will be described. In this embodiment, the landing pads 106 are undercut to provide locking structures that help adhere the molding material to the substrate panel. The locking structure can be formed in a wide variety of ways. In the described embodiment, the locking structure is created during the formation of the multi-layered landing pads. For example, a base layer 151 (e.g. a copper layer) may be applied and patterned first to form a landing pad with a first footprint. Subsequently, an upper layer 153 or 155 (e.g. the barrier layer 153 and/or the gold layer 155) may be formed over the copper layer in a manner that creates a larger footprint than the footprint of the base layer 151. The actual processes used to create the multi-layers structure can be widely varied (and indeed are expected to be varied since it is understood that various substrate manufactures use very different substrate formation and patterning techniques). However, the described improvement can be applied to a wide variety of landing pad formation techniques. It should also be apparent that the same technique can be applied to the die attach pad and/or any other conductive structures on the top surface of the substrate panel. In both FIGS. 5(*a*) and 5(*b*), landing pads 106 are surrounded by solder mask 115.

When molding material is molded over a substrate panel that incorporates the described locking mechanism into the landing pad formation process, the molding material flows into the undercut region of the landing pads thereby providing a better mechanical point of attachment between the substrate and the molding compound. Thus, the molding material adheres better to the substrate panel which again improves the environmental resistance of the resulting devices.

Figure 6:
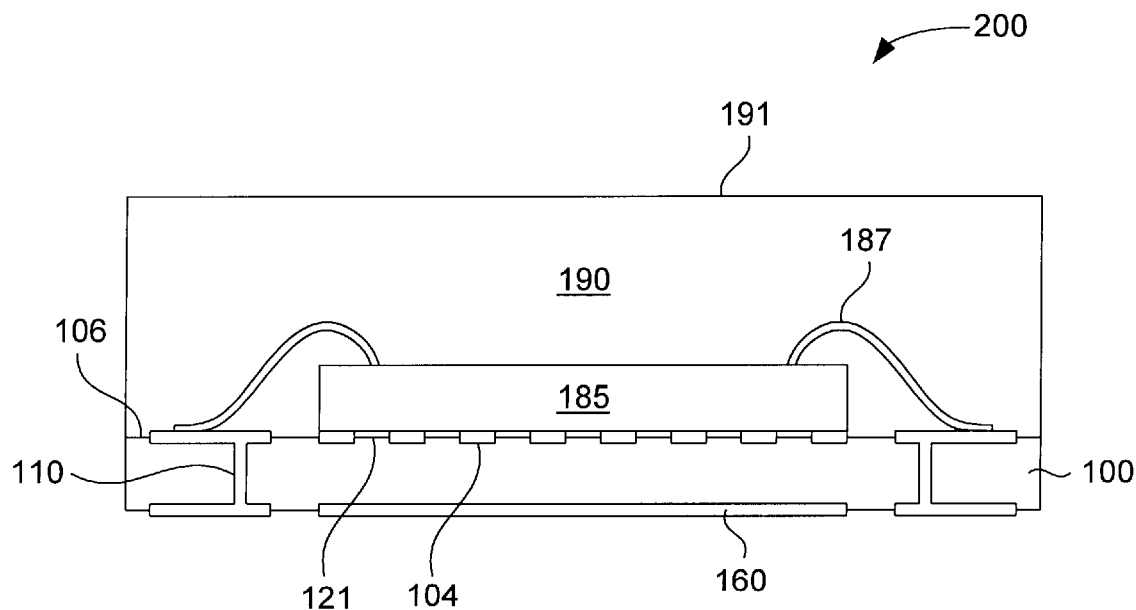
FIG. 6 is a cross sectional side view of a packaged semiconductor device incorporating a substrate formed in accordance with another embodiment of the invention.
Figure 7:
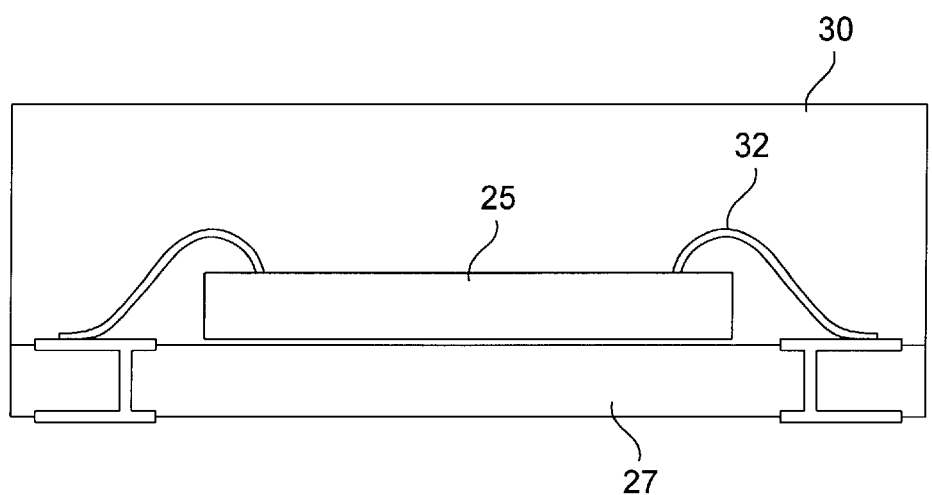
FIG. 7 is a diagrammatic cross sectional side view of a conventional laminate substrate based package.

Another mechanism that can help reduce moisture ingress into the package is to (when possible and appropriate) provide a metal plate 160 (e.g. a copper plate) on the bottom surface of the substrate opposite the die attach pad. This feature is illustrated in the package of FIG. 6. The metal plate can be used to provide enhanced electrical and thermal properties as well. For example, in some embodiments the metal plate can be used as an electrical power plane such as a ground plane.

The described substrates can be used in conventional manners as part of a wide variety of substrate based packages, including ball grid arrays (BGAs), pin grid arrays (PGAs) as well as in various laminate surface mount, leadless and/or chip scale packages. Typically, a plurality of dice 185 are mounted on the panel, with each die 185 being mounted on an associated die attach pad 104 within a particular device area. The dice are then electrically connected to the associated landings (typically by wire bonding). A molding compound 190 is then molded over the top surface of the substrate 100 to form a plastic cap that covers an array of the dice and encapsulates the bonding wires 187. As discussed above, the interfaces between the plastic cap and the substrate tends to be one of the weak spots in laminate packages. The use of some of the described substrate features tends to improve moisture resistance and thus the environmental resistance of the resulting packages.

After the plastic cap 191 has been formed, the substrate panel 100 is typically singulated (diced) to provide individual packaged devices 200 using conventional techniques such as sawing. The devices may be tested in either individual form or when appropriate, in panel form prior to singulation.

The described arrangements working together have been found to significantly enhance the moisture resistance of the resulting laminate packages. For example, in one laminate package design that had a JEDEC MSL rating of level 3 using a conventional substrate, the JEDEC rating rose all the way to level 1. As will be appreciated by those familiar with the art, one advantage to higher rated packages is that they can be shipped to customers with less precautions against moisture since they are already more robust and they are cheaper to store. This can result in significant cost savings. Also, ruggedness tends to increase the useful life of a package.

Although only a few embodiments of the present invention have been described in detail, it should be understood that the present invention may be embodied in many other specific forms without departing from the spirit or scope of the invention. A number of techniques have been described that working together have been found to significantly improve the environmental resistance of resulting packages. It should be appreciated, however, that many of the techniques can be used independently and/or in smaller groups to improve environmental resistance for a variety of different package designs.

Further, in the embodiments shown, the invention is applied to chip scale packages having a single row of landing pads/contacts adjacent each side of the package. Of course, the invention is equally applicable to packages having multiple rows of landing pads/contacts, and/or other different geometries. Therefore, the present examples are to be considered as illustrative and not restrictive, and the invention is not to be limited to the details given herein, but may be modified within the scope of the appended claims.

We claim:

1. A substrate for use in semiconductor packaging, the substrate comprising:
   a substrate panel formed from a dielectric material and having at least one array of device areas defined thereon; and
   a multiplicity of conductive landing pads formed on a first surface of the substrate panel, wherein a plurality of landing pads are provided in each device area and at least some edges of the landing pads are slightly undercut to permit molding material applied during later packaging to flow into the undercut regions to help improve adhesion between the substrate and the molding material.

2. A substrate for use in semiconductor packaging as recited in claim 1 wherein the undercut landing pads are multi-layered structures and an upper layer of each undercut landing pad has a larger footprint than a corresponding lower layer of the undercut landing pad thereby forming the undercut.

3. A substrate for use in semiconductor packaging as recited in claim 2 wherein the upper layer is formed from gold and the lower layer is formed from copper.

4. A substrate for use in semiconductor packaging as recited in claim 1 wherein:
   the landing pads include a copper or copper alloy layer, a barrier layer on top of the copper layer and a gold layer on top of the barrier layer; and
   the footprint of at least one of the barrier layer and the gold layer in each undercut landing pad is larger than the corresponding copper layer of the undercut landing pad thereby forming the undercut.

5. A substrate for use in semiconductor packaging as recited in claim 1 wherein:
   each device area includes a conductive die attach pad on the first surface of the substrate panel, the conductive die attach pads each having a number of opening defined therein that leave corresponding portions of the substrate panel exposed; and
   a solder mask that covers a significant portion of each device area, including the die attach area such that the solder mask adheres directly to the substrate panel in the openings within the die attach pads.

6. A substrate for use in semiconductor packaging as recited in claim 5 wherein:
   each device area includes a plurality of the landing pads arranged in at least one row that extends along at least one side of the die attach area; and
   the solder mask leaves elongated slots open to expose selected rows of the landing pads.

7. A packaged semiconductor device comprising:
   a substrate formed from a dielectric material;
   a multiplicity of conductive landing pads formed on a first surface of the substrate, wherein at least some edges of the landing pads are slightly undercut;
   a die attached to the substrate and electrically connected to selected ones of the landing pads;
   a molding material that covers the die and landing pads wherein the molding material extends into the undercut regions to help improve adhesion between the substrate and the molding material.

8. A substrate for use in semiconductor packaging, the substrate comprising:
   a substrate panel formed from a dielectric material and having at least one array of device areas defined thereon;
   a multiplicity of conductive die attach pads and landing pads formed on a first surface of the substrate panel, wherein each device area includes one of the die attach pads and a plurality of the landing pads, wherein the conductive die attach pads each have a number of openings defined therein that leave corresponding portions of the substrate panel exposed; and
   a solder mask that covers a significant portion of each device area, including the die attach pad such that the solder mask adheres directly to the substrate panel in the openings within the die attach pads.

9. A substrate for use in semiconductor packaging as recited in claim 8 wherein the openings in each die attach pad are arranged in a two-dimensional array.

10. A substrate for use in semiconductor packaging as recited in claim 8 wherein the openings in each die attach pad are substantially rectangular.

11. A substrate for use in semiconductor packaging as required in claim 8, the substrate further comprising a multiplicity of conductive vias formed in the substrate panel, and wherein:
   each landing pad has a first portion that covers an associated one of the vias and a second portion that serves as a point of attachment for a bonding wire in subsequent packaging operations;

each device area includes a plurality of the landing pads arranged in at least one row that extend on at least one side of the die attach area; and the solder mask covers the portions of the landing pads that cover the vias, but leaves elongated slots open to expose at least portions of a series of adjacent ones of the landing pads.

12. A substrate for use in semiconductor packaging as required in claim 8, wherein:

each device area includes a plurality of the landing pads arranged in at least one row that extends along at least one side of the die attach area; and the solder mask leaves elongated slots open to expose selected rows of the landing pads.

13. A packaged semiconductor device comprising:

a substrate formed from a dielectric material;

a conductive die attach pad formed on a first surface of the substrate, the die attach pad having a number of openings defined therein that leave corresponding portions of the substrate exposed;

a plurality of landing pads formed on a first surface of the substrate; and a solder mask that covers a significant portion of the substrate, including the die attach pad such that the solder mask adheres directly to the substrate in the openings within the die attach pads;

a die attached to the substrate over the die attach pad and electrically connected to selected ones of the landing pads;

a molding material that covers the die and landing pads.

14. A substrate for use in semiconductor packaging, the substrate comprising:

a substrate panel formed from a dielectric material and having at least one array of device areas defined thereon, each device area including a die attach area;

a multiplicity of conductive vias formed in the substrate panel;

a multiplicity of conductive landing pads formed on a first surface of the substrate panel, each landing pad having a first portion that covers an associated one of the vias and a second portion that serves as a point of attachment for a bonding wire in subsequent packaging operations, wherein each device area includes a plurality of the landing pads arranged in at least one row that extend on at least one side of the die attach area; and a solder mask that covers a significant portion of each device area, including the portions of the landing pads that cover the vias, while leaving elongated slots open to expose selected rows of the second portions of the landings pads.

15. A packaged semiconductor device comprising:

a substrate formed from a dielectric material;

a plurality of conductive landing pads arranged in at least one row on a first surface of the substrate, each landing pad having a first portion that covers an associated one of the vias and a second portion;

a solder mask that covers a significant portion of the first surface of the substrate, including the portions of the landing pads that cover the vias, while leaving elongated slots open to expose selected rows of the second portions of the landings pads;

a die attached to the substrate and electrically connected to selected ones of the landing pads; and a molding material that covers the die and landing pads.

* * * * *